(12) United States Patent
Okazaki et al.

(10) Patent No.: US 6,284,427 B1
(45) Date of Patent: Sep. 4, 2001

(54) PROCESS FOR PREPARING RESISTS (75) Inventors: Hiroshi Okazaki; Georg Pawlowski; Satoru Funato; Yoshiaki Kinoshita, all of Shizuoka; Yuko Yamaguchi, Kanagawa-ken, all of (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 09/308,582
(22) PCT Filed: Aug. 26, 1998
(86) PCT No.: PCT/JP98/03788
§ 371 Date: Aug. 5, 1999
§ 102(e) Date: Aug. 5, 1999
(87) PCT Pub. No.: WO99/15935
PCT Pub. Date: Apr. 1, 1999

(30) Foreign Application Priority Data

Sep. 22, 1997 (JP) .................................................. 9-275185

(51) Int. Cl.[7] ....................................................... G03C 1/73
(52) U.S. Cl. ..................................... 430/270.1; 430/286.1; 430/285.1; 430/918
(58) Field of Search ............................. 430/270.1, 281.1, 430/286.1, 285.1, 905, 908, 909, 913, 918, 923

(56) References Cited

U.S. PATENT DOCUMENTS

| | | | | |
|---|---|---|---|---|
| 5,069,997 | * | 12/1991 | Schwaim et al. | 430/270.1 |
| 5,663,038 | * | 9/1997 | Mertesdorf et al. | 430/326 |
| 5,714,559 | * | 2/1998 | Schacht et al. | 526/313 |
| 5,723,262 | * | 3/1998 | Makamura et al. | 430/286.1 |
| 5,919,597 | * | 7/1999 | Sinta et al. | 430/270.1 |
| 5,928,818 | * | 7/1999 | Mertesdorf et al. | 430/270.1 |

* cited by examiner

*Primary Examiner*—Janet Baxter
*Assistant Examiner*—Yvette M. Clarke
(74) *Attorney, Agent, or Firm*—Krishna Banerjee (57) ABSTRACT

A resist composition is prepared by reacting an alkali-soluble polymer having a phenolic hydroxyl or carboxyl groups with a vinyl ether compound in an aprotic solvent, such as propylene glycol monomethyl ether acetate, in the presence of an acid catalyst, suspending the reaction by the addition of a base, and directly adding a photoacid generator to the reaction solution. When a dialkyl dicarbonate is used in stead of the vinyl ether compound, a resist composition is prepared by carrying out the reaction in the presence of a basic catalyst and adding a photoacid generator directly to the reaction. Thus resist compositions can be prepared without isolating or purifying an alkali-soluble polymer which has been substituted by a catalytic reaction.

27 Claims, 5 Drawing Sheets

Fig. 1

Result of GPC

| # | Name | Retention time (min) | Area (%) | Mn | MP | Mw | Mz |
|---|---|---|---|---|---|---|---|
| 1 | | 23.000 | 100.00 | 13626 | 26676 | 48235 | 132397 |

| # | Mz+1 | Mz+1/Mw | Mz/Mw | Degree of Dispersion |
|---|---|---|---|---|
| 1 | 251673 | 5.217587 | 2.744815 | 3.539893 |

Result of GPC

| # | Name | Retention time (min) | Area (%) | Mn | MP | Mw | Mz |
|---|---|---|---|---|---|---|---|
| 1 | | 22.883 | 100.00 | 15065 | 28718 | 60824 | 195687 |

| # | Mz+1 | Mz+1/Mw | Mz/Mw | Degree of Dispersion |
|---|---|---|---|---|
| 1 | 403767 | 6.638282 | 3.217266 | 4.037568 |

Fig. 4

Result of GPC

| # | Name | Retention time (min) | Area (%) | Mn | MP | Mw | Mz |
|---|------|----------------------|----------|-----|-----|-----|-----|
| 1 |      | 24.350 | 100.00 | 15078 | 25856 | 67880 | 647051 |

| # | Mz+1 | Mz+1/Mw | Mz/Mw | Degree of Dispersion |
|---|------|---------|-------|----------------------|
| 1 | 3396998 | 50.043996 | 9.532241 | 4.501997 |

Fig. 5

Result of GPC

| # | Name | Retention time (min) | Area (%) | Mn | MP | Mw | Mz |
|---|---|---|---|---|---|---|---|
| 1 | | 26.950 | 100.00 | 4699 | 4812 | 8460 | 14207 |

| # | Mz+1 | Mz+1/Mw | Mz/Mw | Degree of Dispersion |
|---|---|---|---|---|
| 1 | 21385 | 2.527610 | 1.679192 | 1.800381 |

PROCESS FOR PREPARING RESISTS

TECHNICAL FIELD

The present invention relates to a method for preparing a resist composition used in manufacturing semiconductor elements etc. and to a resist composition prepared by this method, and in particular, to a method for preparing a positive-working chemically amplified resist composition sensitive to actinic radiation and to a positive-working chemically amplified resist composition prepared by this method.

BACKGROUND ART

In recent years, fine processing is required for manufacturing semiconductor devices with higher degree of integration, and to attain the higher degree of integration, a shorter wavelength light source comes to be used in a light exposure apparatus used in photolithography. Up to now, the techniques of using KrF excimer laser radiation (248.4 nm) have been established, and a wide variety of resist materials suitable for this wavelength have been found. In Japanese Laid-open Patent Publication Nos. H9-6002, H9-6003, H5-249682, H4-219757, H2-209977, etc., various resist materials suitable for exposure with KrF excimer laser radiation have been reported. These known resist materials include polymers having at least a recurring unit represented by e.g. the following general formula (IV) and polyhydroxystyrenes or phenol resins having tert-butoxycarbonyl groups.

(IV)

wherein $R_{11}$ represents a hydrogen atom or a methyl group, $R_{12}$ and $R_{13}$ independently represent a hydrogen atom or a straight-chain, branched or cyclic alkyl group containing 1 to 6 carbon atoms whereupon $R_{12}$ and $R_{13}$ are simultaneously not hydrogen atoms, or $R_{12}$ and $R_{13}$ may be combined to form a methylene chain containing 2 to 5 carbon atoms, $R_{14}$ represents a straight-chain, branched or cyclic alkyl group containing 1 to 10 carbon atoms, a straight-chain, branched or cyclic haloalkyl group containing 1 to 6 carbon atoms or an aralkyl group, $R_{15}$ represents a hydrogen atom or a cyano group, $R_{16}$ represents a hydrogen atom or a methyl group, $R_{17}$ represents a hydrogen atom, a cyano group or —COOY whereupon Y represents a straight-chain, branched or cyclic alkyl group containing 1 to 6 carbon atoms, or $R_{15}$ and $R_{17}$ may be bound to each other to form —CO—O—CO—, p and q independently represent a natural number provided that $0.1 \leq p/(p+q) \leq 0.9$, and r represents 0 or a natural number provided that when r is a natural number, $0.05 \leq r/(p+q+r) \leq 0.50$.

Such resist materials, together with a photoacid generator for generating an acid upon irradiation to actinic radiation, and, if necessary, an organic base for stabilizing the line width of a pattern and additives for improving characteristics such as optical or mechanical properties, a film forming property, adhesion to a substrate etc., are dissolved in an organic solvent suitable for forming a resist coating to form so-called "chemically amplified resist composition". After the composition is applied to a substrate such as wafer etc., a resist image is formed.

The resist materials, for example represented by the above general formula etc. are synthesized by (1) reaction of (a) a homopolymer of hydroxystyrenes, a copolymer thereof with other monomers, or phenol resin and (b) a vinyl ether compound or di-tert-butyl dicarbonate, (2) homopolymerization of a reaction product from hydroxystyrenes and a vinyl ether compound or di-tert-butyl dicarbonate, or copolymerization thereof with other monomers, or (3) elimination, with an acid if necessary, of a part of functional groups introduced to these homopolymers or copolymers. To conduct these reactions, materials absorbing exposure radiation (e.g. aromatics)are often used as a reaction initiator acid catalyst. However the removal of this catalyst usually requires the step of isolating and purifying the polymer or the step of removing the catalyst, and after these steps, the reaction product is used as the resist material. The reason for the necessity of removing the acid catalyst by a certain method after the reaction is that this reaction is an equilibrium reaction so the remaining acid causes the reverse reaction to significantly deteriorate the performance and storage stability of the resulting photoresist. Further, if the polymer without isolated and purified is used directly to prepare a resist composition, the acid catalyst absorbs exposure radiation to cause unfavorable phenomena such as remaining of resist film after development. Generally to isolate and purify the polymer obtained by any of the preparation processes (1), (2) and (3) described above, the organic solution containing the polymer after the reaction is introduced into water to crystallize the polymer with stirring, and the precipitated crystals are recovered by filtration and washed with water under the present circumstances. And, if necessary, this polymer is dissolved again in a suitable organic solvent, the polymer solution is introduced into water, and the same procedure as above is repeated, followed by drying the precipitated crystals under reduced pressure, whereby the polymer suitable as a resist material (photosensitive material) is obtained. However, it is practically difficult to remove the acid catalyst from the polymer completely, thus permitting a part of the acid catalyst to remain in the polymer. And it causes a reduction in the degree of protection.

In the step of isolating and purifying the polymer as described above, about 5 L of organic solvent and about 150 L of water for crystallizing the polymer with stirring, and about 75 L of water for washing are the minimum requirement for producing about 1 kg of the resist material. Therefore, because of the problem of disposal of waste organic solvent and waste water, practical large-scale production as large as 100 kg batch or more is difficult, and it is also a great problem from the point of view of protection of the environment. Further, it was difficult to control the moisture content in each material in the reaction system up to now, thus leading to variations among lots in the degree of protection of the polymer. So it was necessary to measure the degree of protection after isolating and purifying the polymer, or to measure the moisture content in the reaction system to estimate the amount of a vinyl ether compound introduced into the reaction system in order to achieve desired degrees of protection.

Further, a polymer having a phenolic hydroxyl or carboxyl group protected partially is inherently chemically unstable due to its structure as compared with the usual polymer and undergoes decomposition reaction in the presence of a trace amount of acid or by heating. Decomposition products formed by this decomposition have great adverse influence on the performance of the resulting photoresist. In the conventional isolation and purification process, the elimination or decomposition reaction of the protective groups occurs depending on handling, and owing to variations in the degree of protection of the polymer, poor reproducibility among lots becomes problematic in production. In particular, a problem concerning the stability of the polymer having acetal as a protective group formed by reaction with isopropenyl methyl ether in the isolation and purification steps is reported by Uday Kumar, SPIE, Vol. 3049/135 (1997).

Although highly practical resist materials suitable for exposure with KrF excimer laser radiation have been found as described above, the great problems as described above remain in the conventional method for preparing the resist materials. Therefore, there is great demand for a method for preparing a resist material which is free of these problems, that is, which is suitable for large-scale production, has simplified steps, is effected economically and in a short time, does not pollute the environment, and gives a practical resist material excellent in resist characteristics; and a method for preparing a resist composition using the resist material obtained by this method.

As a result of their eager study and examination, the present inventors found that the degree of protection of the polymer can be controlled within a narrow range and the resist material can be prepared without isolation and purification of the polymer by using specific materials as a reaction catalyst, solvent and reaction stopper, for example by using none of aromatic compound as the acid catalyst in preparing the resist material etc. and by controlling the moisture content in the reaction system at low levels. By this, the problems in the prior art, that is, the problems of the environment, costs, complicated production process, variations in qualities among lots, and use of the unstable polymer as the resist material can be solved all at once, and the present invention is completed.

That is, an object of the present invention is to provide a practical method for preparing a resist composition, particularly a chemically amplified resist composition, which is suitable for exposure not only with deep-ultraviolet rays, KrF or ArF excimer laser radiation but also with electron beams, X-rays, i-line and g-line radiation, as well as a resist composition prepared by this method.

Another object of the present invention is to provide a method for preparing a resist composition wherein the resist composition can be obtained without isolating and purifying resist materials, as well as a resist composition prepared by this method.

An additional object of the present invention is to provide a method for preparing a resist composition economically and in a short time without using a large amount of solvent and water, as well as a resist composition produced by this method.

A further object of the present invention is to provide a method for preparing a resist composition hardly polluting the environment.

DISCLOSURE OF THE INVENTION

The constitution of the present invention for achieving these objects comprises:

1. A method for preparing a resist composition without isolating and purifying resist materials formed by reaction, which comprises reacting an alkali-soluble polymer having a phenolic hydroxyl or carboxyl group with a vinyl ether compound and/or dialkyl dicarbonate in the presence of a catalyst in an aprotic solvent suitable as a resist coating solvent in which these materials can be dissolved, followed by adding at least a photoacid generator to the solution.

2. A method for preparing a resist composition according to item 1 above, wherein the compound to be reacted with the alkali-soluble polymer having a phenolic hydroxyl or carboxyl group is a vinyl ether compound, and these are reacted in the presence of an acid catalyst, followed by adding a base thereto to stop the reaction, then at least a photoacid generator is added to the reaction solution thus formed.

3. A method for preparing a resist composition according to item 1 above, wherein the compound to be reacted with the alkali-soluble polymer having a phenolic hydroxyl or carboxyl group is a dialkyl dicarbonate, and these are reacted in the presence of a base catalyst, followed by adding at least a photoacid generator to the reaction solution thus formed.

4. A method for preparing a resist composition according to item 1 above, wherein the alkali-soluble polymer having a phenolic hydroxyl or carboxyl group is reacted with a vinyl ether compound as reaction compound in the presence of an acid catalyst, followed by adding abase thereto to stop the reaction, then a dialkyl dicarbonate is added to the solution to react in the presence of a base catalyst, and at least a photoacid generator is added to the reaction solution thus formed.

5. A method for preparing a resist composition according to item 1, 3 or 4 above, wherein the dialkyl dicarbonate is di-tert-butyl dicarbonate.

6. A method for preparing a resist composition according to any one of items 1 to 4 above, wherein the alkali-soluble polymer having a phenolic hydroxyl or carboxyl group is a vinyl polymer having at least a recurring unit represented by general formula (I):

wherein $R_1$ represents a hydrogen atom or an alkyl group, $R_2$ represents an alkyl group and m is 0 or an integer of 1 to 4.

7. A method for preparing a resist composition according to item 6 above, wherein the vinyl polymer having at least a recurring unit represented by general formula (I) is at least one member selected from poly(hydroxystyrene), poly(hydroxy-α-methylstyrene), and poly(hydroxymethylstyrene).

8. A method for preparing a resist composition according to any one of items 1 to 4 above, wherein the alkali-soluble polymer having a phenolic hydroxyl or carboxyl group is a vinyl polymer having at least a recurring unit represented by general formula (II):

(II)

wherein $R_3$ represents a hydrogen atom or an alkyl group.

9. A method for preparing a resist composition according to item 8 above, wherein the vinyl polymer having at least a recurring unit represented by general formula (II) is a homo- or co-polymer of acrylic acid or methacrylic acid.

10. A method for preparing a resist composition according to any one of items 1 to 4 above, wherein the alkali-soluble polymer having a phenolic hydroxyl or carboxyl group is a phenol resin.

11. A method for preparing a resist composition according to item 9 above, wherein the phenol resin is a novolak resin.

12. A method for preparing a resist composition according to any one of items 1 to 11 above, wherein the number average molecular weight of the alkali-soluble polymer having a phenolic hydroxyl or carboxyl group is 1,000 to 30,000.

13. A method for preparing a resist composition according to item 1, 2 or 4 above, wherein the vinyl ether compound is one represented by the general formula (III):

(III)

wherein $R_4$, $R_5$ and $R_6$ independently represent a hydrogen atom or a straight-chain, branched, cyclic or hetero-cyclic alkyl group containing 1 to 6 carbon atoms, and $R_7$ represents a straight-chain, branched, cyclic or hetero-cyclic alkyl or aralkyl group containing 1 to 10 carbon atoms which may be substituted with a halogen atom, an alkoxy group, aralkyl oxycarbonyl group and/or alkyl carbonyl amino group.

14. A method for preparing a resist composition according to item 13 above, wherein the vinyl ether compound is isopropenyl methyl ether.

15. A method for preparing a resist composition according to item 1, 2 or 4 above, wherein the vinyl ether compound is a cyclic vinyl ether compound.

16. A method for preparing a resist composition according to item 15 above, wherein the cyclic vinyl ether compound is 3,4-dihydro-2H-pyran.

17. A method for preparing a resist composition according to item 1, 2 or 4 above, wherein the vinyl ether compound is a divinyl ether compound.

18. A method for preparing a resist composition according to item 17 above, wherein the divinyl ether compound is butanediol-1,4-divinyl ether, ethylene glycol divinyl ether or triethylene glycol divinyl ether.

19. A method for preparing a resist composition according to item 1, 2 or 4 above, wherein the vinyl ether compound consists of a combination of 2 or more vinyl ether compounds.

20. A method for preparing a resist composition according to any one of items 1 to 19 above, wherein the vinyl ether compound or dialkyl dicarbonate is used at a ratio of 0.1 to 0.7 mol equivalent to the phenolic hydroxyl or carboxyl group of the alkali-soluble polymer having a phenolic hydroxyl or carboxyl group.

21. A method for preparing a resist composition according to item 2 or 4 above, wherein the acid catalyst is the same kind of acid as a non-aromatic acid generated from the photoacid generator in chemically amplified resist, and the amount of the acid catalyst is 0.1 to 10 mmol equivalent to the hydroxyl or carboxyl group of the alkali-soluble polymer having a phenolic hydroxyl or carboxyl group.

22. A method for preparing a resist composition according to item 21 above, wherein the non-aromatic acid is at least one member selected from mineral acid, organic sulfonic acid and halocarbonic acid.

23. A method for preparing a resist composition according to item 22 above, wherein the mineral acid, organic sulfonic acid and/or halocarbonic acid is at least one member selected from hydrochloric acid, sulfuric acid, methane-sulfonic acid, camphorsulfonic acid, trifluoroacetic acid and trichloroacetic acid.

24. A method for preparing a resist composition according to item 2, 3 or 4 above, wherein the base that is the reaction terminator or base catalyst is at least one member selected from ammonia, organic amine, organic onium hydroxide and conjugate salts thereof.

25. A method for preparing a resist composition according to item 24 above, wherein the base that is the reaction terminator or base catalyst is at least one member selected from ammonia, triethylamine, dicyclohexyl methylamine, tetramethyl ammonium hydroxide, triphenylsulfonium hydroxide, diphenyl iodonium hydroxide, triphenylsulfonium acetate, triphenyl sulfonium camphanate, and triphenylsulfonium camphorate.

26. A method for preparing a resist composition according to any one of items 1 to 25 above, wherein the solvent is at least one member selected from glycol ethers, glycol ether acetates and aliphatic esters having no hydroxyl or keto group.

27. A method for preparing a resist composition according to item 26 above, wherein the solvent is propylene glycol monomethyl ether acetate.

28. A method for preparing a resist composition according to any one of items 1 to 27 above, wherein the content of water in the reaction system is 700 ppm or less.

29. A method for preparing a resist composition according to item 17 above, wherein a low-molecular polyhydroxy aromatic compound is used along with the divinyl ether compound.

30. A resist composition prepared by a method described in any one of items 1 to 29 above.

Hereinafter, the method for preparing resist materials and resist compositions of the present invention, and materials used in the preparation thereof are described in detail.

Preparation of Resist Material

As described above, the resist material is synthesized by reaction an alkali-soluble polymer having a phenolic hydroxyl or carboxyl group with a vinyl ether compound and/or dialkyl dicarbonate in the presence of a catalyst in an aprotic solvent suitable as a resist coating solvent capable of dissolving these materials. Accordingly, in the present invention, solvents such as alcohols and ketones cannot be used for synthesis of the resist material. Specifically, when the vinyl ether compound is used in synthesis, an acid catalyst is used as the catalyst, and the reaction is stopped by adding a base, while when a dialkyl dicarbonate is used, a base catalyst is used as the catalyst, and the reaction solution after synthesis is then formed into a resist composition by directly adding a photoacid generator and as necessary additives to the reaction solution without isolating or purifying the resist material. Accordingly, it is necessary to use the following specific materials as the catalyst, reaction stopper and solvent. Further, in synthesizing the resist material, a low-molecular polyhydroxy aromatic compound is used along with the vinyl ether compound thereby further improving the characteristics of the resist material. Materials etc. used in preparing the resist material in the present invention, that is, (1) alkali-soluble polymer having a phenolic hydroxyl or carboxyl group, (2) vinyl ether compound and dialkyl dicarbonate, (3) low-molecular polyhydroxy aromatic compound, (4) reaction acid catalyst, (5) reaction base catalyst, (6) reaction stopper, (7) solvent used as reaction solvent, and (8) reaction conditions are further described hereinafter.

(1) Alkali-soluble Polymer Having a Phenolic Hydroxyl or Carboxyl Group

The alkali-soluble polymer having a phenolic hydroxyl or carboxyl group used in the present invention may be any polymer containing a phenolic hydroxyl or carboxyl group known to prepare a chemically amplified resist material.

Examples of the alkali-soluble polymer having a phenolic hydroxyl or carboxyl group include polymers having at least a recurring unit represented by the general formula (I) or (II) above or polycondensation resin such as phenol resin.

Preferable examples of the polymer having at least a recurring unit represented by the general formula (I) include a homopolymer of hydroxystyrene, hydroxy-α-methylstyrene, or hydroxymethylstyrene, copolymers using these vinyl monomers, or copolymers of at least one of these vinyl monomers with other monomers. Further, preferable examples of the polymer having at least a recurring unit represented by the general formula (II) include a homopolymer of acrylic acid or methacrylic acid, copolymers using these vinyl monomers, or copolymers of at least one of these vinyl monomers with other monomers. Examples of such polycondensation resin include phenol resin such as novolak resin. The number average molecular weight of these polymers or condensation polymer resin is preferably 1,000 to 30,000. Further, a mixture of the alkali-soluble polymer having a phenolic hydroxyl group and the alkali-soluble polymer having a carboxyl group, or the alkali-soluble polymer having both a phenolic hydroxyl group and a carboxyl group, can also be used.

The vinyl monomers used as a comonomer component in said vinyl polymer include vinyl monomers represented by the general formula (V):

(V)

wherein $R_8$ represents a hydrogen atom or a cyano group, $R_9$ represents a hydrogen atom or a methyl group, $R_{10}$ represents a hydrogen atom, a cyano group or an optionally substituted phenyl group or —COOY whereupon Y represents a straight-chain, branched or cyclic alkyl group containing 1 to 6 carbon atoms, or $R_8$ and $R_{10}$ may be bound to each other to form —CO—O—CO—. Examples of these vinyl monomers include styrene, methyl methacrylate, tert-butyl methacrylate, fumaronitrile etc.

(2) Vinyl Ether Compound and Dialkyl Dicarbonate

The vinyl ether compounds represented by the general formula (III) described above include vinyl ethers such as methyl vinyl ether, ethyl vinyl ether, n-butyl vinyl ether, tert-butyl vinyl ether, 2-chloroethyl vinyl ether, 1-methoxyethyl vinyl ether, 1-benzyloxyethyl vinyl ether etc.; and isopropenyl ethers such as isopropenyl methyl ether, isopropenyl ethyl ether etc.

Preferable examples of cyclic vinyl ethers include 3,4-dihydro-2H-pyran etc., and preferable examples of divinyl ethers include butanediol-1,4-divinyl ether, ethylene glycol divinyl ether, triethylene glycol divinyl ether etc.

These vinyl ether compounds can be used alone or in combination thereof. The vinyl ether compounds in total are used preferably in a ratio of 0.1 to 0.7 mol equivalent to the phenolic hydroxyl or carboxyl group of the alkali-soluble polymer having a phenolic hydroxyl or carboxyl group.

Preferable examples of the dialkyl dicarbonate used in the present invention include di-tert-butyl dicarbonate. As with the vinyl ether compounds, the amount of the dialkyl dicarbonate used is preferably 0.1 to 0.7 mol equivalent to the phenolic hydroxyl or carboxyl group of the alkali-soluble polymer having a phenolic hydroxyl or carboxyl group.

In the present invention, at least one vinyl ether compound and at least one dialkyl dicarbonate can be used simultaneously for protection of a single alkali-soluble polymer described in (1) above.

(3) Low-molecular Polyhydroxy Aromatic Compound

The low-molecular polyhydroxy aromatic compound having 3 or more phenolic hydroxyl groups can raise the degree of crosslinking of polyhydroxystyrene by reacting with the divinyl ether compound. For example, in the case of low-molecular polyphenol having 3 or more phenolic hydroxyl groups represented by trishydroxyphenyl ethane, 3 molecules of polyhydroxystyrene can be crosslinked by a reaction product from the divinyl ether compound and trishydroxyphenyl ethane, whereas 2 molecules of polyhydroxystyrene are crosslinked by 1 molecule of the divinyl ether compound. This increase of the degree of crosslinking results in an improvement in resist contrast, thus improving the performance of the resist. Further, trishydroxyphenyl ethane itself can act as a dissolution promoter to further improve the contrast. Mononuclear trihydroxy benzenes, polynuclear phenols etc. having 3 or more phenolic hydroxyl groups demonstrate the same effect.

(4) Reaction Acid Catalyst

If the resist materials to be synthesized are used as a component of a resist composition exposed with e.g. KrF eximer laser radiation, it is preferable to use a catalyst showing no absorption at 248 nm i.e. the exposure wavelength of KrF excimer laser. Accordingly, when an acid is used as the reaction catalyst, the acid is not to have a benzene ring preferably. Examples of acids which can be used as the reaction catalyst in the present invention include mineral acids such as hydrochloric acid, sulfuric acid etc., organic sulfonic acids such as methanesulfonic acid, camphorsulfonic acid etc. or halocarboxylic acids such as trifluoroacetic acid, trichloroacetic acid etc. The amount of the acid used is preferably 0.1 to 10 mmol equivalents to the phenolic hydroxyl or carboxyl group of the polymer having a phenolic hydroxyl or carboxyl group.

In the case where (+/−)camphorsulfonic acid is used as the reaction catalyst in the form of solution thereof in propylene glycol monomethyl ether acetate, if said solution is heated or stored for a long period of time, the propylene glycol monomethyl ether acetate is hydrolyzed to generate propylene glycol monomethyl ether (PGME) by which the reaction is significantly inhibited. Accordingly, the solution of (+/−) camphorsulfonic acid in propylene glycol monomethyl ether acetate should be prepared just before use.

(5) Reaction Base Catalyst and (6) Reaction Stopper

When a dialkyl dicarbonate is used as a compound to be reacted with the alkali-soluble polymer having a phenolic hydroxyl or carboxyl group, a base is used as the reaction catalyst, while when a vinyl ether compound is used as a compound to be reacted with the alkali-soluble polymer having a phenolic hydroxyl or carboxyl group, a base is used as the reaction stopper. As these bases, usual bases which are optically decomposable or not decomposable and are used as conventional additives in chemically amplified resists can be preferably used. Examples of these bases include ammonia; organic amines such as triethylamine, dicyclohexyl methylamine etc.; ammonium hydroxides represented by tetramethylammonium hydroxide (TMAH), sulfonium hydroxides represented by triphenylsulfonium hydroxide, iodonium hydroxides represented by diphenyliodonium hydroxide and conjugated salts of these onium hydroxides, such as triphenylsulfonium acetate, triphenylsulfonium camphanate, triphenylsulfonium camphorate etc. These reaction base catalysts or reaction stoppers are preferably those which when formed into a resist composition, do not have influence on resist sensitivity, and in particular, optically decomposable bases are preferable. When amine is present in the resist composition, attention should be paid because sensitivity may be lowered. Further, inorganic bases are not preferable because many of them contain metal ions to pollute the substrate such as silicon wafer etc. If the polymer is neither isolated nor purified according to the method for preparing a resist composition of the present invention, the main cause for instability of the polymer in the step of isolation and purification thereof can be eliminated. If abase is used as the reaction stopper, the stability of the polymer is further improved, and even in the case of the polymer having acetal as a protective group, its stability for 2 months or more at room temperature is confirmed.

In the present invention as described above, the step of inactivating the acid catalyst by use of the base is an important step. That is, after the reaction is finished, the base for example triphenylsulfonium acetate or the like is added whereby the acid catalyst is neutralized and inactivated to stop the reaction, so that a polymer solution having storage stability can be obtained. Theoretically, addition of the base in an equivalent amount to the acid is sufficient to inactivate the acid, but because storage stability can be further secured by adding about 10% excess base, addition of about 1.1 equivalents of the base to 1 equivalent of the acid is preferable. This excess base will be taken into consideration in order to determine the amount of another base added as an additive for preparing the resist.

(7) Solvent

The solvent used in synthesis of the resist materials should be one in which the alkali-soluble polymer containing a phenolic hydroxyl or carboxyl group, the vinyl ether compound, the dialkyl dicarbonate, the reaction catalyst, the reaction stopper and further the resist materials formed can be dissolved and which does not inhibit the reaction. In the present invention, as the photoacid generator and other necessary additives for forming a resist composition are added into the reaction solution after stop of the reaction, it is necessary to use the solvent dissolving these additives. The resist composition obtained are applied onto the substrate such as wafer etc. to form a resist film, so that the solvent should be one that gives a excellent application property for the resist composition. A solvent containing a —OH group or a keto group is not preferable because it becomes a main cause for inhibiting the reaction.

Examples of the solvent include glycol ether acetates such as ethylene glycol monoethyl ether acetate and propylene glycol monomethyl ether acetate (PGMEA) and esters such as ethyl-3-ethoxypropionate, methyl-3-methoxypropionate, among which propylene glycol monomethyl ether acetate is preferable. These solvents may be used alone or in the form of a mixture thereof.

(8) Reaction Conditions

The conditions for reacting the alkali-soluble polymer having a phenolic hydroxyl or carboxyl group with the vinyl ether compound or the dialkyl dicarbonate may be the same as in the prior art, and the reaction may be conducted under the same conditions as in the prior art. In this reaction, if water is present in the reaction system, the vinyl ether is decomposed to form aldehyde and alcohol, and the degree of protection by the vinyl ether compound becomes lower than the set value. As the drop of the degree of polymer has a significant effect on the thickness loss of the resist film in developer, the moisture content should be minimized in the reaction system preferably. That is, if the moisture content in the reaction system is controlled to be as low as possible, the degree of protection can be in a certain narrow range, to significantly reduce variations in degrees of protection as compared with the conventional reaction. Accordingly, the moisture content of the reaction solution before the reaction should be measured by Karl Fischer method in order to confirm that the moisture content is within a range of e.g. 500 to 700 ppm. For example, if the moisture content is more than 700 ppm, attention should be paid such that the degree of protection is within a set value, for example by increasing the amount of the vinyl ether compound as necessary. The reaction temperature and reaction time are e.g. 25° C. and 6 hours respectively, but if the protective group is ketal, are e.g. 0° C. and 2 hours respectively.

If a single alkali-soluble polymer is protected by both a vinyl ether compound and a dialkyl dicarbonate, usually the polymer is subjected to protection reaction with the vinyl ether compound in the presence of an acid catalyst and then subjected to protection reaction with the dialkyl dicarbonate in the presence of a base catalyst.

Preparation of Resist Composition

The resist composition is prepared without isolating or purifying the resist material by directly adding to the resist material solution prepared as described above a photoacid generating compound capable of generating an acid upon exposure to actinic radiation (photoacid generator) and if necessary a base and additives for improvement of optical and mechanical characteristics, a film forming property, adhesion with the substrate, etc. optionally in the form of a solution. The viscosity of the composition is regulated by addition of solvent, if necessary. The solvent used in preparing the resist composition is not limited to the type of solvent having been used in synthesizing the resist material, and it is possible to use any solvent which is conventionally used in preparation of a resist composition. Further, any photo acid-generating compounds and other additives, which are used conventionally in chemically amplified resists, can also be used. The total solid content in the resist composition is preferably in the range of 10 to 50% by weight, more preferably 15 to 25% by weight, relative to the solvent.

Hereinafter, the photoacid generator (9), the base (10), and the additives (11) used in the resist composition of the present invention are described in more detail.

(9) Photoacid Generator

Any compounds can be used insofar as they generate acids by irradiation to actinic radiation used in exposure of the resist. Preferable groups of the photoacid generator are shown below, but these are shown for exemplary purposes, and the photoacid generator usable in the resist composition of the present invention is not limited to the following:

(a) bis-sulfonyl diazomethane such as bis(isopropylsulfonyl) diazomethane;

(b) bis-sulfonyl methane such as methylsulfonyl p-toluenesulfonyl methane;

(c) sulfonyl carbonyl diazomethane such as cyclohexylsulfonyl cyclohexylcarbonyl diazomethane;
(d) sulfonyl carbonyl alkanes such as 2-methyl-2-(4-methylphenylsulfonyl)propiophenone;
(e) nitrobenzyl sulfonates such as 2-nitrobenzyl p-toluene sulfonate;
(f) alkyl and aryl sulfonates such as pyrogallol trismethane sulfonate;
(g) benzoin sulfonates such as benzoin tosylate;
(h) N-sulfonyloxyimides such as N-(trifluoromethylsulfonyloxy)phthalimide;
(i) pyridones such as (4-fluorobenzenesulfonyloxy)-3,4,6-trimethyl-2-pyridone;
(j) sulfonates such as 2,2,2-trifluoro-1-trifluoromethyl-1-(3-vinylphenyl)-ethyl-4-chlorobenzene sulfonate; and
(k) onium salts such as triphenylsulfoniummethane sulfonate and diphenyliodonium trifluoromethane sulfonate.

These compounds can be used alone or in combination thereof. Further, although varies depending on various factors including the chemical and physical characteristics of the synthesized resist materials, the quantum yield and absorption parameter of the photoacid generator, the amount of the photoacid generator used is usually 0.1 to 10.0% by weight, preferably 0.5 to 5.0% by weight relative to the synthesized resist materials to achieve their optimum characteristics required for lithography, such as high resolution, deep focus depth and high stability.

(10) Base

The usable base includes radiation-sensitive bases or usual bases not sensitive to radiation. These bases are not necessarily required for resist formulation, but because their addition can prevent the deterioration of pattern characteristics even in the case where the treatment step is conducted with delay, so their addition is preferable. Further, their addition also results in improvements in clear contrast.

Among radiation-sensitive base compounds suitable as bases, particularly preferable examples include e.g. triphenylsulfonium hydroxide, triphenylsulfonium acetate, triphenylsulfonium phenolate, tris-(4-methylphenyl)sulfonium hydroxide, tris-(4-methylphenyl)sulfonium acetate, tris-(4-methylphenyl)sulfonium phenolate, diphenyliodonium hydroxide, diphenyliodonium acetate, diphenyliodonium phenolate, bis-(4-tert-butylphenyl)iodonium hydroxide, bis-(4-tert-butylphenyl)iodonium acetate, bis-(4-tert-butylphenyl)iodonium phenolate etc.

Further, the base compounds not sensitive to radiation include e.g. (a) ammonium salts such as tetramethylammonium hydroxide, tetrabutylammonium hydroxide etc., (b) amines such as n-hexylamine, dodecylamine, aniline, dimethylaniline, diphenylamine, triphenylamine, diazabicyclooctane, diazabicycloundecane etc., and (c) basic heterocyclic compounds such as 3-phenylpyridine, 4-phenylpyridine, lutidine and 2,6-di-tert-butylpyridine.

These base compounds can be used alone or in combination thereof. The amount of the base compound added is determined according to the amount of the photo acid-generating compound and the photo acid-generating ability of the photoacid generator. Usually the base compound is used in a ratio of 10 to 110 mol %, preferably 25 to 95 mole % relative to the amount of the photo acid-generating compound.

(11) Other Additives

Other additives include additives such as light absorbers, dyestuffs, organic carboxylic acids, leveling agents, stabilizers, low-molecular compounds, plasticizer etc. known to improve the optical and mechanical characteristics, film forming property etc. of the resist composition or resist film or those known to improve adhesion with the substrate.

Formation of Resist Image

The resist composition produced by the method of the present invention is used to form resist images by a resist image formation method known in the art. That is, the resist composition prepared by the method of the invention is applied directly or after regulation of its viscosity onto the conventional substrate such as wafer etc. in a method known in the art, such as spin coating etc., then pre-baked, exposed with radiation, and subjected if necessary to post-exposure baking, followed by development with an alkaline developer such as 23.8% by weight of aqueous tetramethylammonium hydroxide (TMAH) to form resist images.

BEST MODE FOR CARRYING OUT THE INVENTION

Hereinafter, the present invention is described in more detail by reference to the Examples, which however are not intended to limit the present invention.

EXAMPLE 1

Preparation 1 of poly{p-[1-(2-chloroethoxy)ethoxy]styrene-p-hydroxystyrene}

Figure 1:
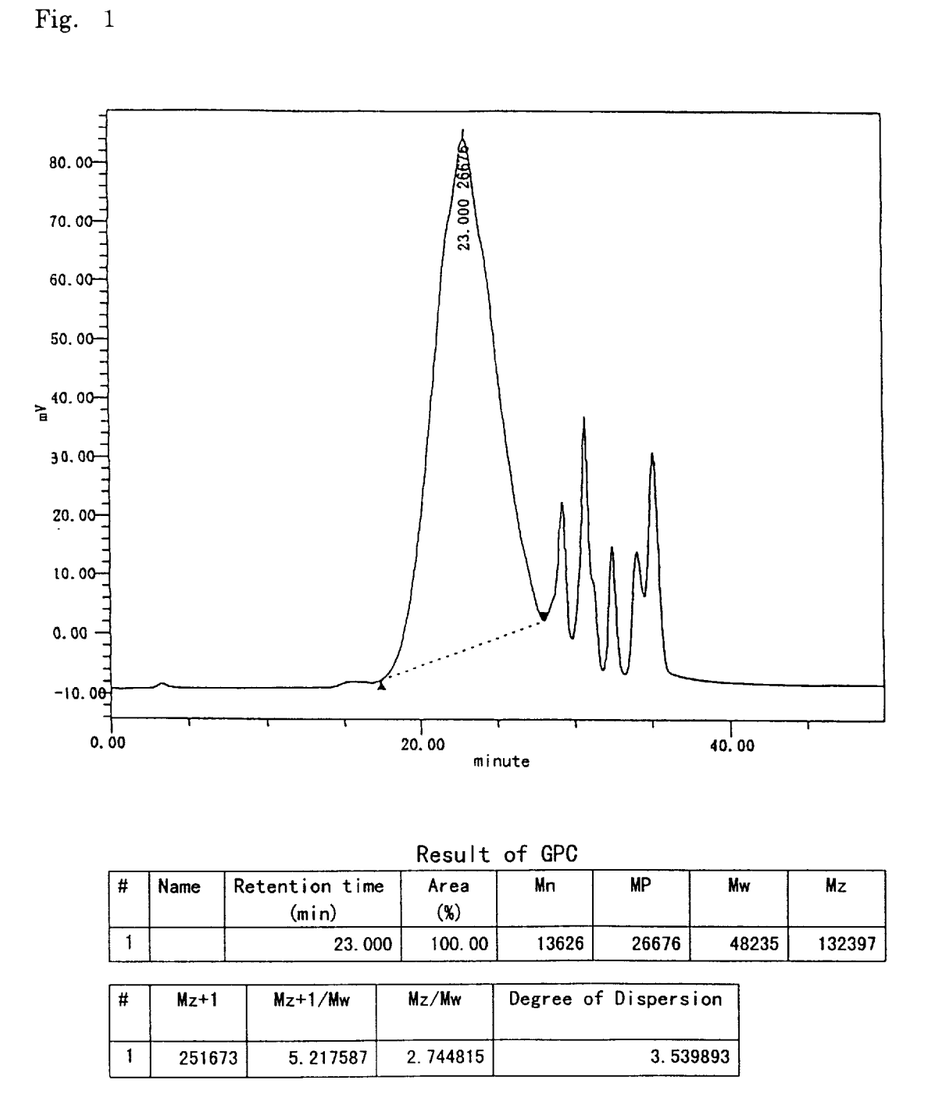
FIG. 1 shows the result of the measurement by gel permeation chromatography (GPC) of the reaction product obtained in Example 1.

A 3 L round-bottom flask heated in a drying oven at 100° C., dried in dry nitrogen and returned to room temperature was charged with 400 g of polyhydroxystyrene (PHS15E01, with a number average molecular weight Mn=8,000, manufactured by Hoechst Celanese Co.) which had been heated and dried (treated at 0.1 mm Hg, 75° C. for 2 or more days and returned to 1 pressure by purging with dry nitrogen). After 2500 g of propylene glycol monomethyl ether acetate (PGMEA) was added thereto, the contents were purged with nitrogen so as to prevent humidity, and the mixture was dissolved with stirring at 25° C. with a magnetic stirrer. About 30 minutes were required for this dissolution. In this step, the moisture content of the solution was measured by Karl Fischer method and it was thereby confirmed that the moisture content was between 500 ppm to 700 ppm. Then, 112.6 g of 2-chloroethyl vinyl ether (0.317 equivalent to the hydroxyl group of polyhydroxystyrene) was added all at once to this solution. Then, 0.774 g of (+/−)camphorsulfonic acid (anhydride) was dissolved in 20 g of PGMEA at room temperature and immediately added to the above solution. The reaction was conducted at 25° C. for 6 hours in a closed system. To prevent humidity in the reaction system, the pressure was regulated by connection to a dry nitrogen line etc. so as to be (internal pressure)>(external pressure). The reaction was stopped by adding 33.3 g of 0.1 mmol/g triphenylsulfonium acetate (TPSA) solution in PGMEA (1 equivalent to (+/−)camphorsulfonic acid) all at once. Upon addition of the TPSA solution in this step, the reaction solution became opaque to gradually form needle crystals, and about 1 hour later, the needle crystals were dissolved. The resulting solution was one containing about 16.27% by weight of poly{p-[1-(2-chloroethoxy)ethoxy]styrene-p-hydroxystyrene}. The number average molecular weight of the resulting polymer, as determined by gel permeation chromatography (GPC) under the following conditions, was about 14,000 (see FIG. 1).

GPC measurement conditions (the same conditions were used in all measurements described below)

Column: 2×PLge 15 μm MIXED-C

Sample concentration: 0.1% (w/v), provided that the sample is filtered through a 0.2 μm filter before injection.

Injection volume: 100 μL

Mobile phase: THF (with no stabilizer added)

Flow rate: 0.6 ml/min.

Measurement temp.: 40° C.

Detector: UV ($\lambda$=254 nm)

Measurement of Molecular Weight by Use of Polystyrene as the Standard

Further, by measurement in thermogravimetric analysis (TGA), it was confirmed that the polyhydroxystyrene and 2-chloroethyl vinyl ether reacted almost quantitatively except that a part of the 2-chloroethyl vinyl ether was decomposed by reacting with a trace amount of water present in the reaction system.

Preparation of Photoresist Composition 0.063 g of triphenylsulfonium trifluoromethanesulfonic acid (ZK 9302; manufactured by Dainippon Pharmaceutical Co., Ltd.) (acid generator), 0.918 g of 0.1 mmol/g triphenyl sulfonium acetate (TPSA) solution in PGMEA, 0.153 g of 0.2% Megafuck solution (trade mark, an agent for improving affinity for substrate and a film-forming property upon spin-coating a resist) were added to 30 g of the solution produced in the above process, and the solid contents were adjusted to 15.5% with PGMEA to give a photoresist solution.

Formation of Resist Image

Figure 2:
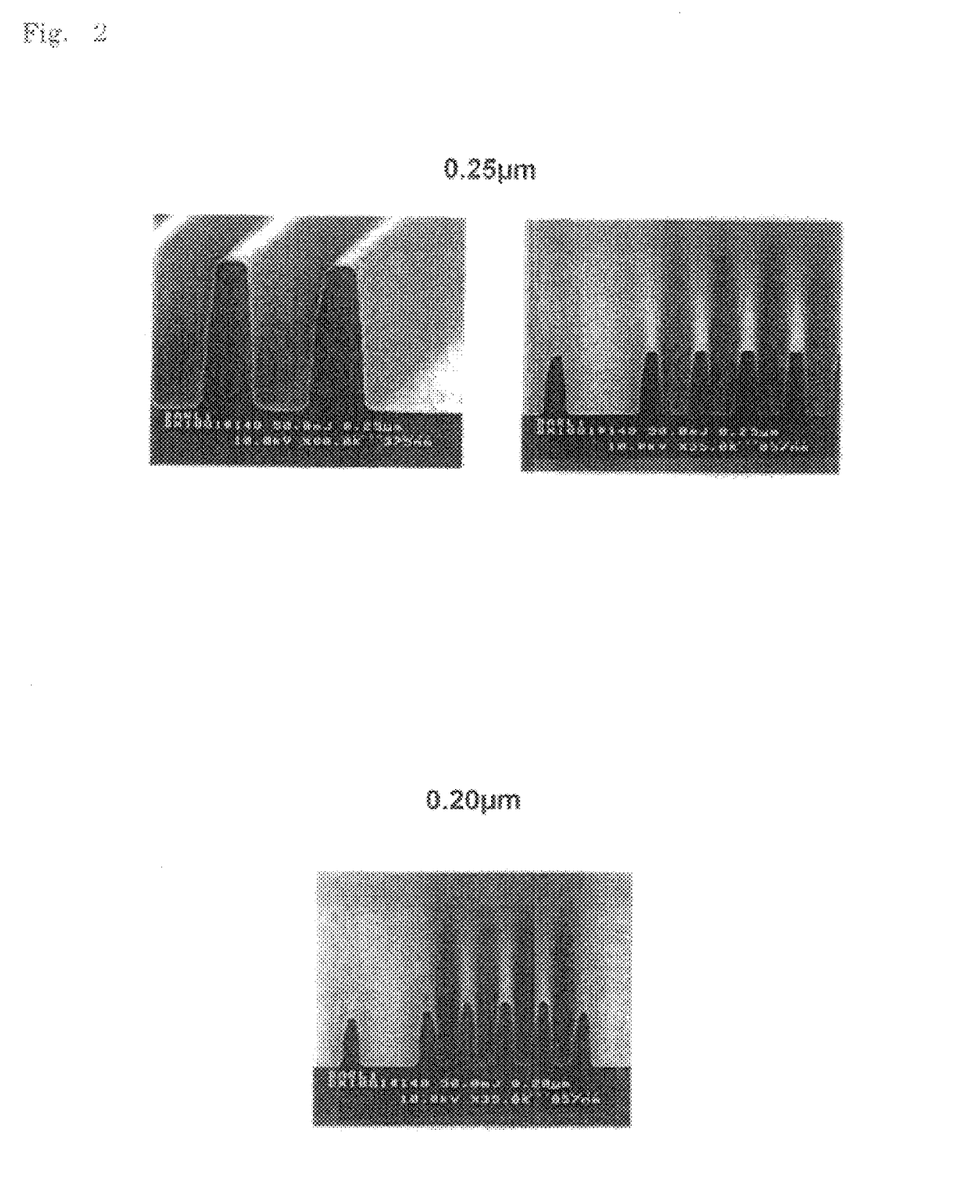
FIG. 2 shows the shape of a resist pattern formed using the photoresist composition in Example 1, which is observed under a scanning electron microscope.

The above photoresist solution was spin-coated onto a semiconductor substrate etc. and pre-baked on a hot plate at 110° C. for 60 seconds to form a photoresist film having a thickness of 0.750 μm. This photoresist film was selectively irradiated via a mask with KrF excimer laser radiation at 248.4 nm, subjected to post-exposure baking on a hot plate at 70° C. for 90 seconds, and developed for 60 seconds in an alkaline developer (2.38% by weight of aqueous tetramethylammonium hydroxide) whereby a positive pattern having a line and space resolution of 0.20 μm or less was obtained (FIG. 2). The performance of this photoresist was equivalent to that of a photoresist prepared using a polymer prepared by a conventional method.

EXAMPLE 2

Preparation 2 of poly{p-[1-(2-chloroethoxy)ethoxy]styrene-p-hydroxystyrene}

The same operation as in Example 1 was repeated. However, when the reaction was stopped, an aqueous solution of TMAH corresponding to 1 equivalent to (+/−)camphorsulfonic acid was used in stead of 33.3 g of 0.1 mmol/g TPSA solution in PGMEA was used. The resulting solution was one containing about 16.27% by weight of poly{p-[1-(2-chloroethoxy)ethoxy]styrene-p-hydroxystyrene}. The number average molecular weight of the resulting polymer, as determined by GPC in the same manner as in Example 1, was about 14,000. By TGA measurement in the same manner as in Example 1, it was confirmed that the polyhydroxystyrene and 2-chloroethyl vinyl ether reacted almost quantitatively except that a part of the 2-chloroethyl vinyl ether was decomposed by reacting with a trace amount of water present in the reaction system.

A photoresist solution was prepared by using the product in the same manner as in Example 1, and exposed and developed under the same conditions in Example 1 whereby a positive pattern having a line and space resolution of 0.20 μm or less was obtained. The performance of this photoresist was equivalent to that of a photoresist prepared using a polymer prepared by a conventional method.

Reference Example 1

Preparation of poly{p-[1-(2-chloroethoxy)ethoxy]styrene-p-hydroxystyrene} (conventional method of isolating and purifying a polymer)

Figure 3:
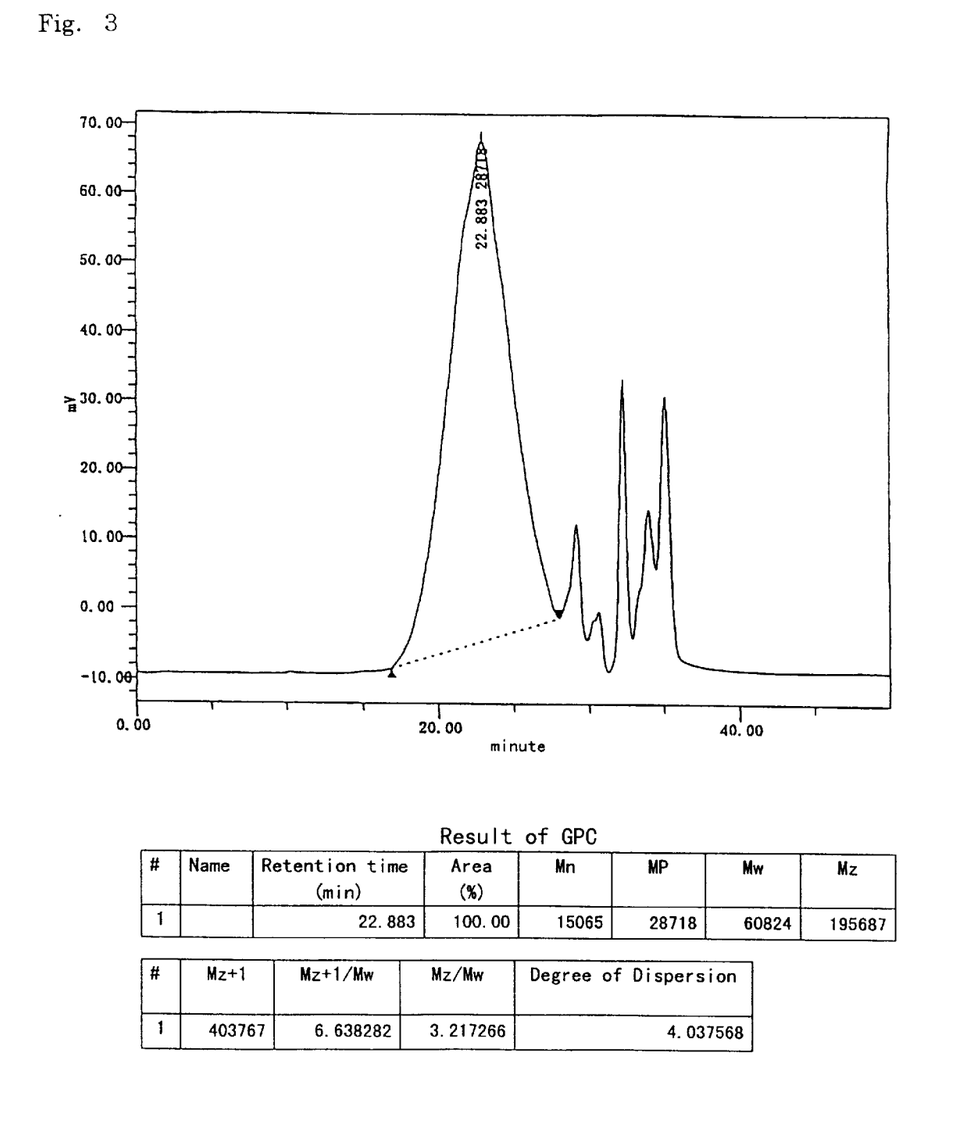
FIG. 3 shows the result of the measurement by GPC of the reaction product obtained in Reference Example 1.

A 10 L round-bottom flask heated in a drying oven at 100° C., dried in dry nitrogen and returned to room temperature was charged with 1.6 kg of polyhydroxystyrene (PHS15E01) which had been heated and dried (treated at 0.1 mm Hg, 75° C. for 2 or more days and returned to 1 pressure by purging with dry nitrogen). After 8 L of tetrahydrofuran (anhydride) was added thereto, the contents were purged with nitrogen so as to prevent humidity, and the mixture was dissolved with stirring at 25° C. with a mechanical stirrer. Then, 447.3 g of 2-chloroethyl vinyl ether was added all at once to the polyhydroxystyrene solution, then 2.4 g of p-toluenesulfonic acid was dissolved in 30 g of tetrahydrofuran (anhydride) at room temperature and immediately added to the above solution. The reaction was conducted at 25° C. for 6 hours in a closed system. The reaction was stopped by adding an aqueous solution of TMAH (prepared by diluting 4.6 ml of 25% aqueous TMAH solution (1 equivalent to p-toluene sulfonic acid) with 30 ml water) all at once to the reaction solution. The resulting solution was added dropwise for 1 hour to 240 L of 10% aqueous methanol under vigorous stirring to precipitate the polymer. The resulting polymer was washed 3 times with 30 L water, then the crystals were ground with a blender, further washed 3 times with 30 L water, and dried at 75° C. under reduced pressure to give about 1.9 kg white powder. The number average molecular weight of the resulting poly{p-[1-(2-chloroethoxy)ethoxy]styrene-p-hydroxystyrene} was about 15,000 (measured by GPC, see FIG. 3), and the degree of protection was about 19.0% (by weight, measured by TGA).

Preparation of Photoresist Composition 3.1 g of the polymer obtained in the above process was dissolved in 16.2 g PGMEA, and triphenylsulfonium trifluoromethanesulfonic acid, triphenylsulfonium acetate, and Megafuck were added thereto at the same ratio as in Example 1, to give a photoresist solution containing 17.0% by weight of solids.

Formation of Resist Image

The photoresist solution prepared above was used to form a resist image in the same manner as in Example 1, whereby a positive pattern having a line and space resolution of 0.20 μm or less was obtained.

EXAMPLE 3

Preparation of poly[p-(1-ethoxyethoxy)styrene-p-(tetrahydropyranyl)styrene-p-hydroxystyrene]

Figure 4:
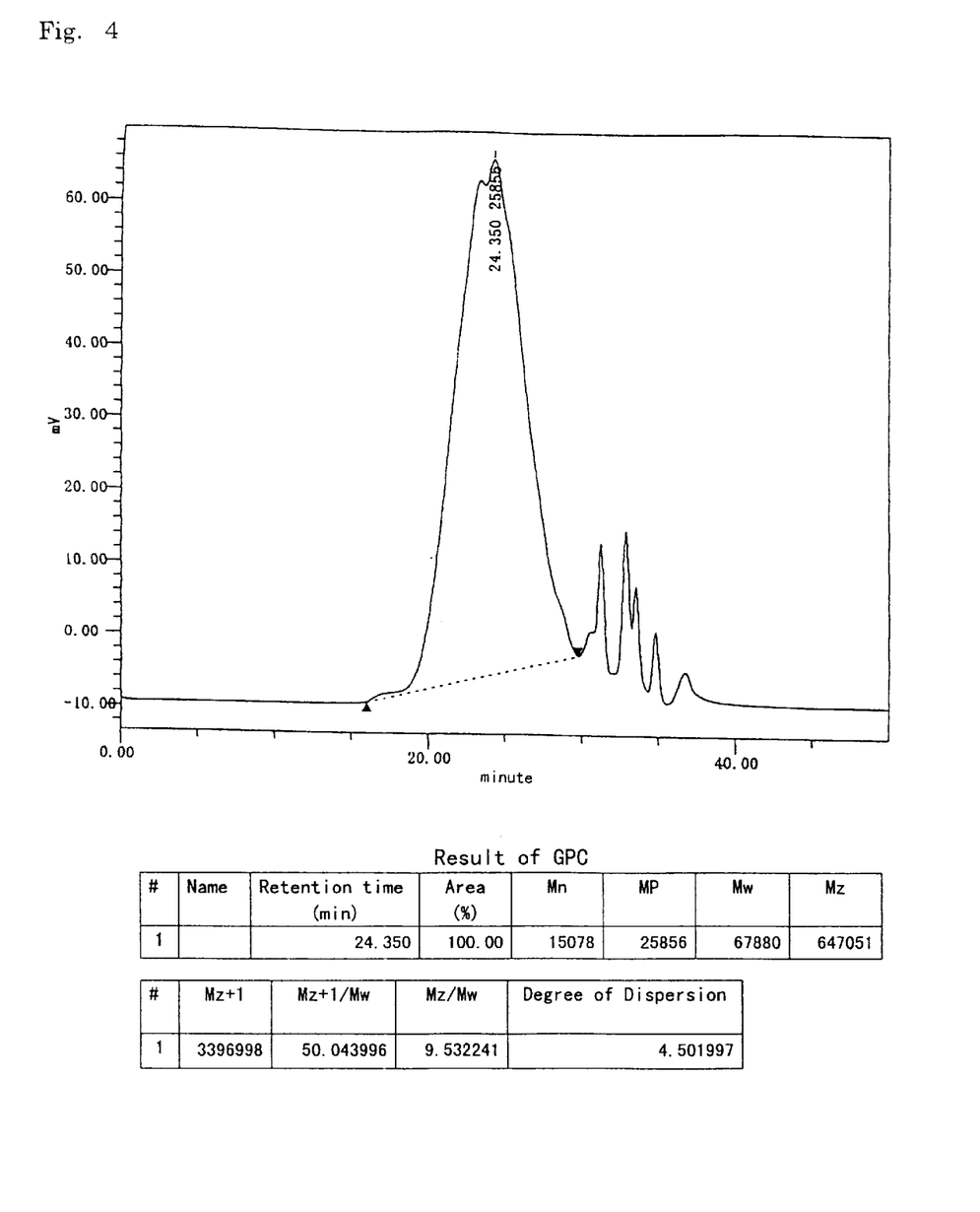
FIG. 4 shows the result of the measurement by GPC of the reaction product obtained in Example 3.

A 300 ml round-bottom flask heated in a drying oven at 100° C., dried in dry nitrogen and returned to room temperature was charged with 16 g of polyhydroxystyrene (PHS15E01) which had been heated and dried (treated at 0.1 mm Hg, 75° C. for 2 or more days and returned to 1 pressure by purging with dry nitrogen) . After 80 g of PGMEA was added thereto, the contents were purged with nitrogen so as to prevent humidity, and the mixture was dissolved with stirring at 25° C. with a magnetic stirrer. Then, 4.33 g of ethyl vinyl ether and 1.0 g of 3,4-dihydro-2H-pyran were added all at once to the polyhydroxystyrene solution. Then, 0.0278 g of (+/−) camphorsulfonic acid (anhydride) was dissolved in 1.2 g of PGMEA at room temperature and immediately added to the above solution. The reaction was conducted at 25° C. for 6 hours in a closed system. The reaction was stopped by adding 1.2 g of 0.1 mmol/g TPSA solution in PGMEA (1 equivalent to (+/−)camphorsulfonic acid) all at once. Upon addition of the TPSA solution in this step, the reaction solution became opaque to gradually form needle crystals, and about 1 hour later, the needle crystals were dissolved. The resulting solution was one containing about 20.63% by weight of poly[p-(1-ethoxyethoxy)styrene-p(tetrahydropyranyl)styrene-p-hydroxystyrene]. The number average molecular weight of the resulting polymer, as determined by GPC in the same manner as in Example 1, was about 15,000 (see FIG. 4).

A photoresist solution was prepared by using the product, and exposed and developed under the same conditions as in Example 1 whereby a positive pattern having a line and space resolution of 0.20 µm or less similar to that in the Example 1 was obtained. By TGA measurement, it was confirmed that the ethyl vinyl ether and 3,4-dihydro-2H-pyran reacted almost quantitatively with the polyhydroxystyrene except that a part of the ethyl vinyl ether and 3,4-dihydro-2H-pyran was decomposed by reacting with a trace amount of water present in the reaction system.

EXAMPLE 4

Figure 5:
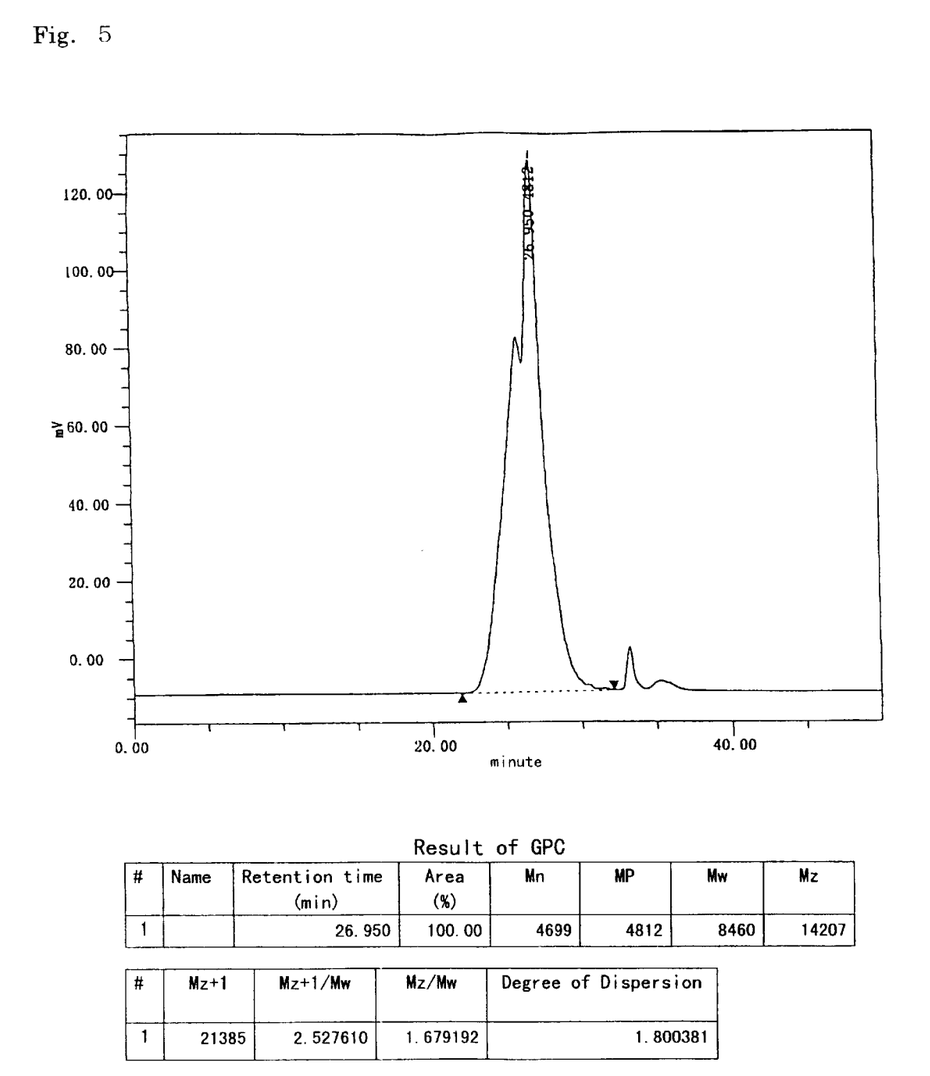
FIG. 5 shows the result of the measurement by GPC of the reaction product obtained in Example 4.

Preparation of poly[p-(1-ethoxyethoxy)styrene-p-hydroxystyrene] cross-linked by triethylene glycol divinyl ether and use thereof as a resist material A 300 ml round-bottom flask heated in a drying oven at 100° C., dried in dry nitrogen and returned to room temperature was charged with 16 g of polyhydroxystyrene (VP2500, number average molecular weight Mn=3,000, manufactured by Nippon Soda Co., Ltd.) which had been heated and dried (treated at 0.1 mm Hg, 75° C. for 2 or more days and returned to 1 pressure by purging with dry nitrogen), and further 80 g of PGMEA was added thereto, and the contents were purged with nitrogen so as to prevent humidity, and the mixture was dissolved with stirring at 25° C. with a magnetic stirrer. Then, 4.33 g of ethyl vinyl ether and 0.87 g of triethylene glycol divinyl ether were added all at once to the polyhydroxystyrene solution. Then, 0.0278 g of (+/−)camphorsulfonic acid (anhydride) was dissolved in 1.2 g of PGMEA at room temperature and immediately added to the above solution. The reaction was conducted at 25° C. for 6 hours in a closed system. The reaction was stopped by adding 1.2 g of 0.1 mmol/g TPSA solution in PGMEA (1 equivalent to (+/−) camphorsulfonic acid) all at once. Upon addition of the TPSA solution in this step, the reaction solution became opaque to gradually form needle crystals, and about 1 hour later, the needle crystals were dissolved. The resulting solution was one containing about 20.46% by weight of poly[p-(1-ethoxyethoxy)styrene-p-hydroxystyrene] which was cross-linked by the triethylene glycol divinyl ether. The number average molecular weight of the resulting polymer was about 4,700 (measured by GPC, see FIG. 5). By TGA measurement, it was confirmed that the ethyl vinyl ether and triethylene glycol divinyl ether reacted almost quantitatively with the polyhydroxystyrene except that a part of the ethyl vinyl ether and triethylene glycol divinyl ether was decomposed by reacting with a trace amount of water present in the reaction system.

A photoresist solution was prepared by using the product in the same manner as in Example 1, and exposed and developed under the same conditions as in Example 1 whereby a positive pattern having a line and space resolution of 0.20 µm or less was obtained. There is none of the prior art in which 2 or more vinyl ether compounds as shown in Examples 3 and 4 are reacted with polyhydroxystyrenes, and according to this method, it was found that resist pattern characteristics such as contrast could be improved.

EXAMPLE 5

Preparation of poly[p-(1-methoxy-1-methylethoxy) styrene-p-hydroxystyrene] and use thereof as a resist material A 300 ml round-bottom flask heated in a drying oven at 100° C., dried in dry nitrogen and returned to room temperature was charged with 16 g of polyhydroxystyrene (PHS15E01) which had been heated and dried (treated at 0.1 mm Hg, 75° C. for 2 or more days and returned to 1 pressure by purging with dry nitrogen). After 80 g of PGMEA was added thereto, the contents were purged with nitrogen so as to prevent humidity, and the mixture was dissolved with stirring at 25° C. with a magnetic stirrer. Then, 4.33 g of isopropenyl methyl ether was added all at once to the polyhydroxystyrene solution. Then, 0.0278 g of (+/−) camphorsulfonic acid (anhydride) was dissolved in 1.2 g of PGMEA at room temperature and immediately added to the above solution. The reaction was conducted at 0° C. for 2 hours in a closed system. The reaction was stopped by adding 1.2 g of 0.1 mmol/g TPSA solution in PGMEA (1 equivalent to (+/−) camphorsulfonic acid) all at once. Upon addition of the TPSA solution in this step, the reaction solution became opaque to gradually form needle crystals, and about 1 hour later, the needle crystals were dissolved. The resulting solution was one containing about 20.46% by weight of poly[p-(1-methoxy-1-methylethoxy)styrene-p-hydroxystyrene]. The number average molecular weight of the resulting polymer was about 15,000 (measured by GPC). By TGA measurement, it was confirmed that the polyhydroxystyrene and isopropenyl methyl ether reacted almost quantitatively except that a part of the isopropenyl methyl ether was decomposed by reacting with a trace amount of water present in the reaction system. According to the evaluation of the resist characteristics, the polymer was extremely stable without removal or decomposition of the protective groups in a polymer, as compared with the one isolated and purified.

A photoresist solution was prepared by using the product in the same manner as in Example 1, and exposed and developed under the same conditions as in Example 1 whereby a positive pattern having a line and space resolution of 0.20 µm or less was obtained.

EXAMPLE 6

Preparation of poly{p-[1-(2-chloroethoxy)ethoxy] styrene-p-hydroxystyrene-styrene} and use thereof as a resist material A 3 L round-bottom flask heated in a drying oven at 100° C., dried in dry nitrogen and returned to room temperature was charged with 400 g of poly(styrene-p-hydroxystyrene) (copolymerization ratio of 1:9, number average molecular weight 15,000, manufactured by Hoechst Celanese Co.) which had been heated and dried (treated at 0.1 mm Hg, 75° C. for 2 or more days and returned to 1 pressure by purging dry nitrogen). After 2500 g PGMEA was added thereto, the contents were purged with nitrogen so as to prevent humidity, and the mixture was dissolved with stirring at 25° C. with a magnetic stirrer. About 30 minutes were required for this dissolution. Then, 101.3 g of 2-chloroethyl vinyl ether was added all at once to the poly(styrene-p-hydroxystyrene) solution, and then 0.774 g of (+/−) camphorsulfonic acid (anhydride) was dissolved in 20 g of PGMEA at room temperature and immediately added to the above solution. The reaction was conducted at 25° C. for 6 hours in a closed system, and the reaction was stopped by adding 33.3 g of 0.1 mmol/g TPSA solution in PGMEA (1 equivalent to (+/−) camphorsulfonic acid) to the solution all at once. Upon addition of the TPSA solution in this step, the reaction solution became opaque to gradually form needle crystals, and about 1 hour later, the needle crystals were dissolved. The resulting solution was one containing about 16.27% by weight of poly{p-[1-(2-chloroethoxy)ethoxy] styrene-p-hydroxystyrene-styrene}. The number average molecular weight of the resulting polymer was about 15,000 (measured by GPC). By TGA measurement, it was confirmed that the poly[styrene-p-hydroxystyrene (1:9)] and 2-chloroethyl vinyl ether reacted almost quantitatively except that a part of the 2-chloroethyl vinyl ether was decomposed by reacting with a trace amount of water present in the reaction system.

A photoresist solution was prepared by using the product in the same manner as in Example 1, and exposed and developed under the same conditions as in Example 1 whereby a positive pattern having a line and space resolution of 0.20 μm or less was obtained.

EXAMPLE 7

Preparation of poly{[1-(2-chloroethoxy)ethoxy] methacrylate-methylmethacrylate-methacrylic acid} and use thereof as a resist material A 3 L round-bottom flask heated in a drying oven at 100° C., dried in dry nitrogen and returned to room temperature was charged with 400 g of poly(methyl methacrylate-methacrylic acid) (molecular weight, 9,000; acid value, 111 KOH mg/g) which had been heated and dried (treated at 0.1 mm Hg, 75° C. for 2 or more days and returned to 1 pressure by purging with dry nitrogen). After 2500 g of PGMEA was added thereto, the contents were purged with nitrogen so as to prevent humidity, and the mixture was dissolved with stirring at 25° C. About 30 minutes were required for this dissolution. Then, 42.19 g of 2-chloroethyl vinyl ether was added all at once to the poly(methyl methacrylate-methacrylic acid) solution, and 0.774 g of (+/−) camphorsulfonic acid (anhydride) was dissolved in 20 g of PGMEA at room temperature and immediately added to the above solution. The reaction was conducted at 25° C. for 6 hours in a closed system, and the reaction was stopped by adding 33.3 g of 0.1 mmol/g TPSA solution in PGMEA (1 equivalent to (+/−)camphorsulfonic acid) all at once to the reaction solution. Upon addition of the TPSA solution in this step, the reaction solution became opaque to gradually form needle crystals, and about 1 hour later, the needle crystals were dissolved. The resulting solution was one containing about 16.27% by weight of poly{[1-(2-chloroethoxy) ethoxy]methacrylate-methylmethacrylate-methacrylic acid}. The number average molecular weight of the resulting polymer was about 16,000 (measured by GPC). By TGA measurement, it was confirmed that the methacrylic acid in the polymer and the 2-chloroethyl vinyl ether reacted almost quantitatively except that a part of the 2-chloroethyl vinyl ether was decomposed by reacting with a trace amount of water present in the reaction system.

A photoresist solution was prepared by using the product in the same manner as in Example 1, and exposed and developed under the same conditions as in Example 1 whereby a positive pattern having a line and space resolution of 0.20 μm or less was obtained.

EXAMPLE 8

Preparation of poly[p-(tert-butoxycarbonyloxy) styrene-p-hydroxystyrene] and use thereof as a resist material A 100 ml round-bottom flask was charged with 8 g of polyhydroxystyrene (VP8000, number average molecular weight Mn=8,000, manufactured by Nippon Soda Co., Ltd.) in the same manner as in Example 1. After 40 g of PGMEA was added to this flask, the contents were purged with nitrogen so as to prevent humidity in the same manner as in Example 1, and the mixture was dissolved with stirring at 25° C. Then, 5.38 g of di-tert-butyl dicarbonate was added to this solution. Then, 2.50 g of triethylamine (1 equivalent to the dicarbonate) was added to this solution, and the mixture was reacted at 23° C. for 10 hours. The resulting solution was one containing about 20.10% by weight of poly[p-(tert-butoxycarbonyloxy)styrene-p-hydroxystyrene].

A photoresist solution was prepared by using the product in the same manner as in Example 1, and exposed and developed under the same conditions as in Example 1 whereby an excellent pattern was obtained. The sensitivity of the resultant photoresist was 39.5 mJ/cm$^2$ and the resolution was 0.25 μm.

EXAMPLE 9

Preparation of poly[p-(1-ethoxyethoxy)styrene-p-(tert-butoxycarbonyloxy)styrene-p-hydroxystyrene] and use thereof as a resist material A 100 ml round-bottom flask was charged with 8 g of polyhydroxystyrene (VP8000) in the same manner as in Example 1. After 40 g of PGMEA was added to this flask, the contents were purged with nitrogen so as to prevent humidity in the same manner as in Example 1, and the mixture was dissolved with stirring at 25° C. Then, 1.56 g of ethyl vinyl ether was added to this solution. Then, 0.6 g of 0.1 mmol/g camphorsulfonic acid (CSA) solution in PGMEA was added to the above solution, and the mixture was reacted at 25° C. for 6 hours. The reaction was stopped by adding 0.6 g of 0.1 mmol/g TPSA in PGMEA. Then, 0.98 g of triethylamine and 2.11 g of di-tert-butyl dicarbonate were added to it and reacted at 23° C. for 10 hours. The resulting solution was one containing about 20.11% by weight of poly[p-(1-ethoxyethoxy)styrene-p-(tert-butoxycarbonyloxy)styrene-p-hydroxystyrene].

A photoresist solution was prepared by using the product in the same manner as in Example 1, and exposed and developed under the same conditions as in Example 1 whereby an excellent pattern was obtained. The sensitivity of the resulting photoresist was 38.0 mJ/cm$^2$ and the resolution was 0.19 μm.

EXAMPLE 10

Preparation of poly[p-(1-ethoxyethoxy)styrene-p-(tert-butoxycarbonyloxy)styrene-p-hydroxystyrene] cross-linked by triethylene glycol divinyl ether and use thereof as a resist material A 100 ml round-bottom flask was charged with 8 g of polyhydroxystyrene (VP8000) in the same manner as in Example 1. After 40 g of PGMEA was added to this flask, the contents were purged with nitrogen so as to prevent humidity in the same manner as in Example 1, and the mixture was dissolved with stirring at 25° C. Then, 1.93 g of ethyl vinyl ether and 0.16 g of triethylene glycol divinyl ether were added to this solution. Then, 0.6 g of 0.1 mmol/g camphorsulfonic acid (CSA) in PGMEA was added to the above solution, and the mixture was reacted at 25° C. for 6 hours. Then, 1.2 g of 0.1 mmol/g TPSA in PGMEA was added thereto and 0.95 g of di-tert-butyl dicarbonate was added to this solution. The mixture was reacted at 23° C. for 10 hours. The resulting solution was one containing about 19.97% by weight of poly[p-(1-ethoxyethoxy)styrene-p-(tert-butoxycarbonyloxy)styrene-p-hydroxystyrene] cross-linked by the triethylene glycol divinyl ether.

A photoresist solution was prepared by using the product in the same manner as in Example 1, and exposed and developed under the same conditions as in Example 1 whereby an excellent pattern was obtained. The sensitivity of the resulting photoresist was 38.0 mJ/cm$^2$ and the resolution was 0.18 $\mu$m.

EXAMPLE 11

The same procedure as in Example 10 was repeated except that polyhydroxystyrene (VP2500) was used in stead of the polyhydroxystyrene (VP8000) and that the triethylene glycol divinyl ether was used in an amount of 0.52 g.

The sensitivity of the resulting photoresist was 36.0 mJ/cm$^2$ and the resolution was 0.18 $\mu$m.

EXAMPLE 12

The same procedure as in Example 10 was repeated except that 0.082 g of trishydroxyphenylethane was used along with the ethyl vinyl ether and triethylene glycol divinyl ether.

The sensitivity of the resulting photoresist was 36.0 mJ/cm$^2$ and the resolution was 0.18 $\mu$m.

EXAMPLE 13

The same procedure as in Example 11 was repeated except that 0.26 g of trishydroxyphenylethane was used along with the ethyl vinyl ether and triethylene glycol divinyl ether.

The sensitivity of the resulting photoresist was 32.0 mJ/cm$^2$ and the resolution was 0.18 $\mu$m.

EXAMPLE 14

Preparation of poly[p-(1-ethoxyethoxy)styrene-p-hydroxystyrene-styrene-tert-butyl methacrylate] and use thereof as a resist material A 100 ml round-bottom flask was charged with 8 g of a poly(hydroxystyrene-styrene-tert-butyl methacrylate (71:19:10)) copolymer (Poly Tz, a number average molecular weight of 12,100, manufactured by Hoechst Celanese Co.) in the same manner as in Example 1. After 40 g of PGMEA was added to this flask, the contents were purged with nitrogen so as to prevent humidity in the same manner as in Example 1, and the mixture was dissolved with stirring at 25° C. Then, 0.81 g of ethyl vinyl ether and 0.6 g of 0.1 mmol/g camphorsulfonic acid (CSA) in PGMEA were added in this order to the above solution, and the mixture was reacted at 25° C. for 6 hours. The reaction was stopped by adding 0.6 g of 0.1 mmol/g TPSA in PGMEA. The resulting solution was one containing about 17.62% by weight of poly[p-(1-ethoxyethoxy)styrene-p-hydroxystyrene-styrene-tert-butyl methacrylate].

A photoresist solution was prepared by using the product in the same manner as in Example 1, and exposed and developed under the same conditions as in Example 1 whereby an excellent pattern was obtained. The thickness loss of the resulting resist film in developer was 3.3 nm/min., its sensitivity was 39.5 mJ/cm$^2$ and its resolution was 0.19 $\mu$m.

EXAMPLES 15 to 17

The same procedure as in Example 14 was repeated except that in stead of 0.81 g of the ethyl vinyl ether, 1.2 g of 2-chloroethyl vinyl ether (Example 15), 1.43 g of cyclohexyl vinyl ether (Example 16) and 0.67 g of ethylene glycol divinyl ether (Example 17) were used, whereby polymers consisting of Poly Tz protected with these 3 vinyl ether compounds were produced.

Photoresist solutions were prepared by using the product, exposed and developed in the same manner as in Example 1 whereby excellent patterns were obtained. The characteristics of each of these resist compositions in Examples 15 to 17, along with their starting materials, are shown in Table 1.

TABLE 1

|  | Example 15 | Example 16 | Example 17 |
| --- | --- | --- | --- |
| PolyTz | 8 g | 8 g | 8 g |
| PGMEA | 40 g | 40 g | 40 g |
| 2-chloroethyl vinyl ether | 1.2 g |  |  |
| Cyclohexyl vinyl ether |  | 1.43 g |  |
| ethylene glycol divinyl ether |  |  | 0.64 g |
| CSA (0.1 mmol/g) | 0.6 g | 0.6 g | 0.6 g |
| TPSA (0.1 mmol/g) | 0.6 g | 0.6 g | 0.6 g |
| Thickness loss of resist film in developer (nm/min) | 11.58 | 13.71 | 22.06 |
| Sensitivity (mJ/cm$^2$) | 48.0 | 42.0 | 50.0 |
| Resolution ($\mu$m) | 0.18 | 0.19 | 0.18 |

EFFECT OF THE INVENTION

The polymer material synthesized by the method for preparing a resist material of the present invention is used, as a photosensitive material for resist compositions, without isolation from the reaction solution and purifying. Therefore, resist compositions can be prepared at lower costs without requiring any complicated process and in a shorter time than in the existing production process. Furthermore, there is no variation in protection degrees of polymers among production lots; furthermore, polymers which are unstable in the step of isolation and purification can also be used as the resist materials; and a large amount of solvent and water which is required in the prior art for isolating and purifying polymers is not required, so organic solvent waste and water waste causing the destruction of the environment is not generated. Accordingly, the present invention allows resist compositions essential for superfine pattern formation in semiconductor industry etc. to be produced efficiently and inexpensively without polluting the environment, thus making significant contribution to industry.

INDUSTRIAL APPLICABILITY

As described above, the resist compositions of the invention are used for superfine pattern formation in semiconductor industry etc. and according to the method for preparing resist compositions of the invention, these resist composi- tions can be produced efficiently and inexpensively without polluting the environment.

What is claimed is:

1. A method for preparing a resist composition, which comprises the steps of:
   (I) providing a solution of a resist material made by a process comprising reacting (i) at least one alkali-soluble polymer having a phenolic hydroxyl or carboxyl group with (ii) at least one vinyl ether compound and/or (iii) at least one dialkyl dicarbonate in the presence of a catalyst in an aprotic solvent suitable as a resist coating solvent in which these materials can be dissolved;
   (II) thereafter, adding at least one photoacid generator to the solution of the resist material in step (I), to form the resist composition;
   wherein the resist material is made without isolating or purifying the reaction product of (i) and (ii) and/or (iii); wherein in step (I), the process comprises first reacting the alkali-soluble polymer (i) with the vinyl ether compound (ii) in the presence of an acid catalyst, followed by adding a base thereto to stop the reaction, and wherein the base is at least one member selected from the group consisting of triphenylsulfonium hydroxide, diphenyliodonium hydroxide, triphenylsulfonium acetate, triphenylsulfonium camphanate, and triphenylsulfonium camphorate.

2. The method of claim 1, wherein in step (I), the process comprises reacting the alkali-soluble polymer (i) with only the vinyl ether compound (ii).

3. The method of claim 1, wherein the alkali-soluble polymer (i) is a vinyl polymer having at least a recurring unit represented by general formula (I);

(I)

wherein $R_1$ represents a hydrogen atom or an alkyl group, $R_2$ represents an alkyl group, and m is 0 or an integer of 1 to 4.

4. The method of claim 3, wherein the vinyl polymer having at least a recurring unit represented by general formula (I) is at least one member selected from the group consisting of poly(hydroxystyrene), poly(hydroxy-α-methylstyrene), and poly(hydroxymethylstyrene).

5. The method of claim 1, wherein the alkali-soluble polymer (i) is a phenol resin.

6. The method of claim 5, wherein the phenol resin is a novolak resin.

7. The method of claim 1, wherein the number average molecular weight of the alkali-soluble polymer (i) is 1,000–30,000.

8. The method of claim 1, wherein the vinyl ether compound (ii) is one represented by the formula (III);

(III)

wherein $R_4$, $R_5$ and $R_6$ represent independently a hydrogen atom or a straight-chain, branched, cyclic or hetero-cyclic alkyl group containing 1 to 6 carbon atoms, and $R_7$ represents a straight-chain, branched, cyclic or hetero-cyclic alkyl or aralkyl group containing 1 to 10 carbon atoms which may be substituted with a halogen atom, an alkoxy group, aralkyl oxycarbonyl group and/or alkyl carbonyl amino group.

9. The method of claim 8, wherein the vinyl ether compound (ii) is isopropenyl methyl ether.

10. The method of claim 1, wherein the vinyl ether compound (ii) is a cyclic vinyl ether compound.

11. The method of claim 1, wherein the vinyl ether compound (ii) is a divinyl ether compound.

12. The method of claim 11, wherein the divinyl ether compound is at least one member selected from the group consisting of butanediol-1,4-divinyl ether, ethylene glycol divinyl ether and triethylene glycol divinyl ether.

13. The method of claim 11, wherein a low-molecular weight polyhydroxy aromatic compound is used along with the divinyl ether compound.

14. The method of claim 1, wherein (ii) comprises at least 2 vinyl ether compounds.

15. The method of claim 1, wherein the solution of the resist material has a moisture content of 700 ppm or less.

16. A resist composition prepared by the method of claim 1.

17. A method for preparing a resist composition, which comprises the steps of:
   (I) providing a solution of a resist material made by a process comprising reacting (i) at least one alkali-soluble polymer having a phenolic hydroxyl or carboxyl group with (ii) at least one vinyl ether compound and/or (iii) at least one dialkyl dicarbonate in the presence of a catalyst in an aprotic solvent suitable as a resist coating solvent in which these materials can be dissolved;
   (II) thereafter, adding at least one photoacid generator to the solution of the resist material in step (I), to form the resist composition;
   wherein the resist material is made without isolating or purifying the reaction product of (i) and (ii) and/or (iii); and wherein in step (I), the process comprises reacting the alkali-soluble polymer (i) with only the dialkyl dicarbonate (iii) in the presence of a base catalyst.

18. The method of claim 17, wherein the dialkyl dicarbonate (iii) is di-tert-butyl dicarbonate.

19. A method for preparing a resist composition, which comprises the steps of:
   (I) providing a solution of a resist material made by a process comprising reacting (i) at least one alkali-soluble polymer having a phenolic hydroxyl or carboxyl group with (ii) at least one vinyl ether compound and/or (iii) at least one dialkyl dicarbonate in the presence of a catalyst in an aprotic solvent suitable as a resist coating solvent in which these materials can be dissolved;
   (II) thereafter, adding at least one photoacid generator to the solution of the resist material in step (I), to form the resist composition;
   wherein the resist material is made without isolating or purifying the reaction product of (i) and (ii) and/or (iii); and wherein in step (I), the process comprises first reacting the alkali-soluble polymer (i) with the vinyl ether compound (ii) in the presence of an acid catalyst, followed by adding a base thereto to stop the reaction, followed by reacting the alkali-soluble polymer (i) with the dialkyl dicarbonate (iii) in the presence of a base catalyst.

20. A method for preparing a resist composition, which comprises the steps of:

(I) providing a solution of a resist material made by a process comprising reacting (i) at least one alkali-soluble polymer having a phenolic hydroxyl or carboxyl group with (ii) at least one vinyl ether compound and/or (iii) at least one dialkyl dicarbonate in the presence of a catalyst in an aprotic solvent suitable as a resist coating solvent in which these materials can be dissolved;

(II) thereafter, adding at least one photoacid generator to the solution of the resist material in step (I), to form the resist composition;

wherein the resist material is made without isolating or purifying the reaction product of (i) and (ii) and/or (iii); and wherein the alkali-soluble polymer (i) comprises a homo- or co-polymer of acrylic acid or methacrylic acid.

21. A method for preparing a resist composition, which comprises the steps of:

(I) providing a solution of a resist material made by a process comprising reacting (i) at least one alkali-soluble polymer having a phenolic hydroxyl or carboxyl group with (ii) at least one vinyl ether compound and/or (iii) at least one dialkyl dicarbonate in the presence of a catalyst in an aprotic solvent suitable as a resist coating solvent in which these materials can be dissolved;

(II) thereafter, adding at least one photoacid generator to the solution of the resist material in step (I), to form the resist composition;

wherein the resist material is made without isolating or purifying the reaction product of (i) and (ii) and/or (iii); and wherein the vinyl ether compound (ii) is 3,4-dihydro-2H-pyran.

22. A method for preparing a resist composition, which comprises the steps of:

(I) providing a solution of a resist material made by a process comprising reacting (i) at least one alkali-soluble polymer having a phenolic hydroxyl or carboxyl group with (ii) at least one vinyl ether compound and/or (iii) at least one dialkyl dicarbonate in the presence of a catalyst in an aprotic solvent suitable as a resist coating solvent in which these materials can be dissolved;

(II) thereafter, adding at least one photoacid generator to the solution of the resist material in step (I), to form the resist composition;

wherein the resist material is made without isolating or purifying the reaction product of (i) and (ii) and/or (iii); and wherein the vinyl ether compound (ii) or the dialkyl dicarbonate (iii) is used at a ratio of 0.1 to 0.7 mol equivalent to the phenolic hydroxyl or carboxylic group in the alkali-soluble polymer (i).

23. A method for preparing a resist composition, which comprises the steps of:

(I) providing a solution of a resist material made by a process comprising reacting (i) at least one alkali-soluble polymer having a phenolic hydroxyl or carboxyl group with (ii) at least one vinyl ether compound in the presence of an acid catalyst in an aprotic solvent suitable as a resist coating solvent in which these materials can be dissolved, followed by adding a base to stop the reaction;

(II) thereafter, adding at least one photoacid generator to the solution of the resist material in step (I), to form the resist composition;

wherein the resist material is made without isolating or purifying the reaction product of (i) and (ii); and wherein the acid catalyst is a non-aromatic acid, and is present at a level of 0.1 to 10 mmol equivalent to the hydroxyl or carboxyl group of the alkali-soluble polymer (i).

24. The method of claim 23, wherein the non-aromatic acid is at least one member selected from the group consisting of mineral acids, organic sulfonic acids and halocarboxylic acids.

25. The method of claim 24, wherein the mineral acid, organic sulfonic acid and/or halocarboxylic acid is at least one member selected from the group consisting of hydrochloric acid, sulfuric acid, methanesulfonic acid, camphorsulfonic acid, trifluoroacetic acid and trichloroacetic acid.

26. A method for preparing a resist composition, which comprises the steps of:

(i) providing a solution of a resist material made by a process comprising reacting (i) at least one alkali-soluble polymer having a phenolic hydroxyl or carboxyl group with (ii) at least one vinyl ether compound and/or (iii) at least one dialkyl dicarbonate in the presence of a catalyst in an aprotic solvent suitable as a resist coating solvent in which these materials can be dissolved;

(II) thereafter, adding at least one photoacid generator to the solution of the resist material in step (I), to form the resist composition;

wherein the resist material is made without isolating or purifying the reaction product of (i) and (ii) and/or (iii); and wherein the aprotic solvent is at least one member selected from the group consisting of glycol ethers, glycol ether acetates and aliphatic esters, which have neither hydroxyl nor keto group.

27. The method of claim 26, wherein the aprotic solvent is propylene glycol monomethyl ether acetate.

* * * * *